US012334017B2

(12) United States Patent
Kim et al.

(10) Patent No.: US 12,334,017 B2
(45) Date of Patent: Jun. 17, 2025

(54) METHOD AND APPARATUS FOR STORING NON-VOLATILE DISPLAY PIXEL DATA

(71) Applicant: INDUSTRY-UNIVERSITY COOPERATION FOUNDATION HANYANG UNIVERSITY ERICA CAMPUS, Ansan-si (KR)

(72) Inventors: Younghyun Kim, Ansan-si (KR); Seoungmin Park, Ansan-si (KR); Yonggyeong Lee, Ansan-si (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 0 days.

(21) Appl. No.: 18/814,219

(22) Filed: Aug. 23, 2024

(65) Prior Publication Data

US 2025/0104628 A1    Mar. 27, 2025

(30) Foreign Application Priority Data

Sep. 21, 2023   (KR) .................. 10-2023-0126142

(51) Int. Cl.
  *G09G 3/3233*    (2016.01)
  *G09G 3/32*     (2016.01)
  (Continued)

(52) U.S. Cl.
  CPC ............. *G09G 3/3233* (2013.01); *G09G 3/32* (2013.01); *H10B 43/35* (2023.02);
  (Continued)

(58) Field of Classification Search
  None
  See application file for complete search history.

(56) References Cited

U.S. PATENT DOCUMENTS

2017/0287399 A1*  10/2017  Ahmed ................ G09G 3/3233
2018/0158415 A1*   6/2018  Chaji .................. G09G 3/3258
(Continued)

FOREIGN PATENT DOCUMENTS

KR   10-2018-0122371 A   11/2018
KR   1020190036578 A     4/2019
(Continued)

OTHER PUBLICATIONS

Dan-Dan Liu et al. Voltage-Polarity Dependent Programming Behaviors of Amorphous In—Ga—Zn—O Thin-Film Transistor Memory with an Atomic-Layer-Deposited ZnO Charge Trapping Layer Nanoscale Research Letters (2019) https://doi.org/10.1186/s11671-019-3204-7.

(Continued)

*Primary Examiner* — Dorothy Harris

(57) ABSTRACT

The present disclosure relates to a display pixel that has a memory function, including a switching TFT configured to control whether the pixel is driven, a charge trapping TFT configured to control a pixel driving current and perform a memory function, a storage capacitor configured to maintain a voltage applied based on the switching TFT, a first light-emitting light source configured to emit light through a current applied based on the CTTFT, and a second light-emitting light source configured to emit light to erase data based on the memory function of the CTTFT.

19 Claims, 29 Drawing Sheets

(51) Int. Cl.
*H10B 43/35* (2023.01)
*H10K 59/121* (2023.01)

(52) U.S. Cl.
CPC . *H10K 59/1213* (2023.02); *G09G 2300/0814* (2013.01); *G09G 2300/0847* (2013.01); *G09G 2310/0262* (2013.01); *G09G 2310/08* (2013.01); *G09G 2320/0223* (2013.01); *G09G 2330/021* (2013.01)

(56) References Cited

U.S. PATENT DOCUMENTS

| | | | |
|---|---|---|---|
| 2019/0096321 A1* | 3/2019 | Yang | H05B 45/60 |
| 2019/0189054 A1* | 6/2019 | Yang | G09G 3/3258 |
| 2019/0347994 A1* | 11/2019 | Lin | G09G 3/32 |
| 2023/0106571 A1* | 4/2023 | Shen | G11C 8/14 |
| | | | 257/314 |

FOREIGN PATENT DOCUMENTS

| | | |
|---|---|---|
| KR | 10-2042004 B1 | 11/2019 |
| KR | 10-2321174 B1 | 10/2021 |
| KR | 10-2023-0049528 A | 4/2023 |
| KR | 10-2616037 B1 | 12/2023 |

OTHER PUBLICATIONS

"Fabrication of a-ITZO Charge-Trapping FET Using Ion-Beam Sputtered Al2O3/HfO2/Al2O3 for Memory-In-Pixel Display Applications" by Seoung min Park, Tae Hyeon Noh and Younghyun Kim. IMID 2023 Digest. Aug. 23, 2023.

* cited by examiner

- Prior Art -

- Prior Art -

WHEN USING CHANNEL LAYER
OF CTTFT HAVING P-TYPE

WHEN USING CHANNEL LAYER
OF CTTFT HAVING N-TYPE

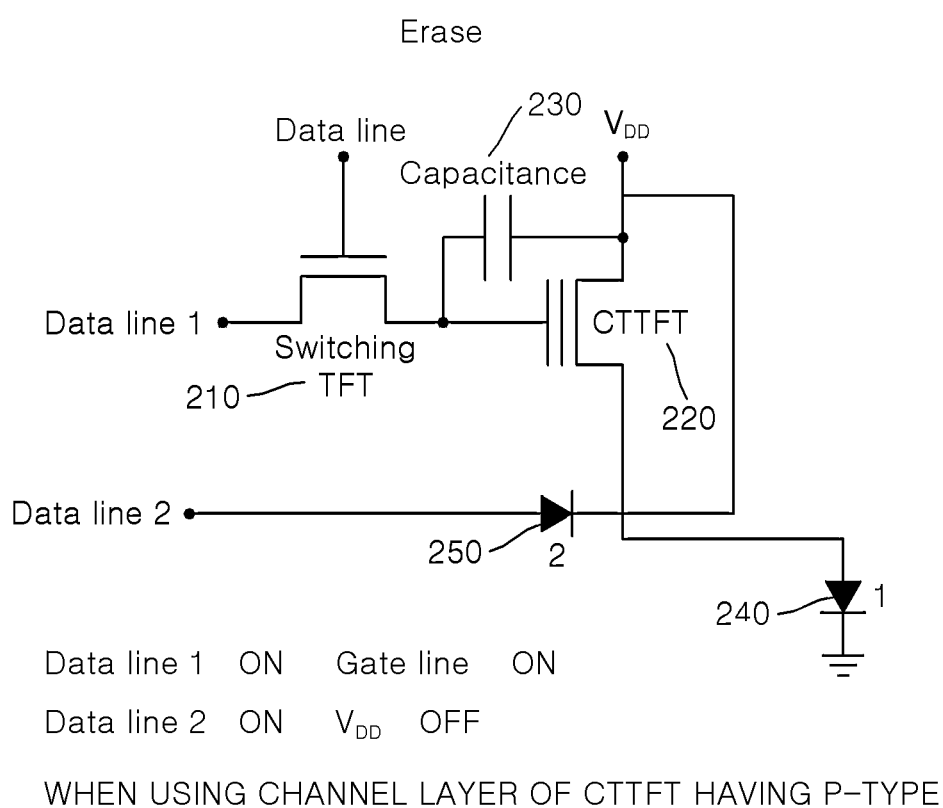

Program

WHEN USING CHANNEL LAYER OF CTTFT HAVING N-TYPE

Erase

Data line 1 : ON    Gate line : ON
Data line 2   ON    $V_{DD}$   OFF

WHEN USING CHANNEL LAYER OF CTTFT HAVING N-TYPE

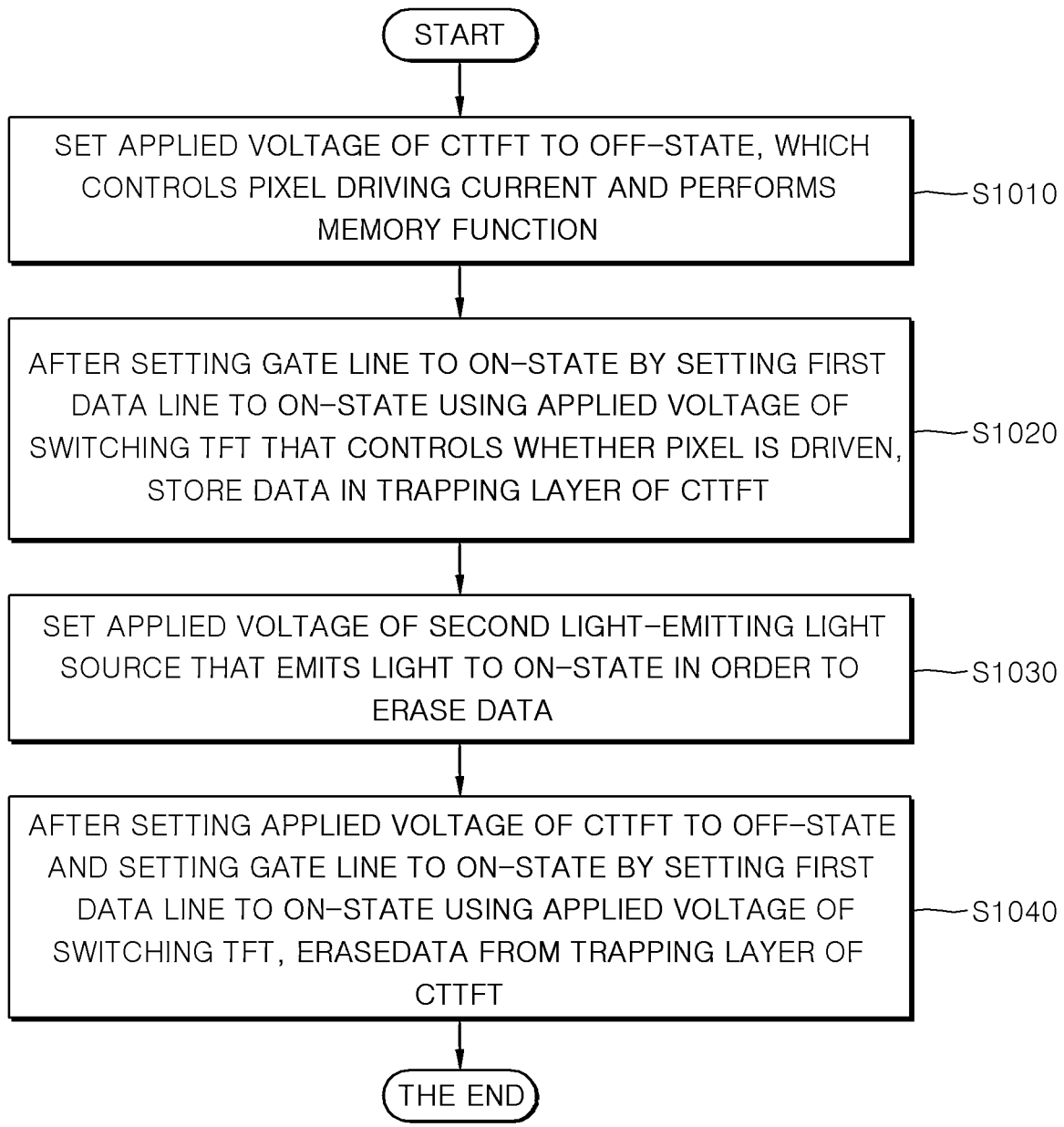

METHOD AND APPARATUS FOR STORING NON-VOLATILE DISPLAY PIXEL DATA

CROSS-REFERENCE TO RELATED APPLICATION

This application claims the benefit of priority to Korean Patent Application No. 10-2023-0126142, filed on Sep. 21, 2023, the disclosure of which is incorporated herein by reference in its entirety.

BACKGROUND

1. Field of the Invention

The present disclosure relates to a method and an apparatus for storing non-volatile display pixel data. Specifically, the present disclosure relates to a method and an apparatus for storing pixel data by replacing a driving thin film transistor (TFT) of a non-volatile display pixel with a charge trapping memory.

2. Discussion of Related Art

Recently, display technologies have been attracting attention, in particular, display technologies operating based on ultra-high resolution and ultra-low power are attracting attention. Meanwhile, as the resolution of displays increases with the use of ultra-high resolution displays, the amount of data that needs to be expressed on the displays may increase. However, as the amount of data that needs to be expressed on the display increases, the power consumption occurring when continuously outputting screens through the display may increase. In addition, when the amount of data that needs be expressed on the display increases, the response time for utilizing display pixel data may increase, resulting in delay, and a solution to this may be needed.

A charge trapping memory may operate based on a method of trapping and storing charges in a trapping layer and may be a memory with high usability. By solving the above-described problem with a display pixel memory using a charge trap, a new structure of a display pixel memory offering high data accessibility and operating with low power consumption will be described hereinafter.

RELATED ART DOCUMENT

Patent Document

Korean Patent Publication No. 10-2023-0049528A

SUMMARY OF THE INVENTION

The present disclosure relates to a method and an apparatus for storing non-volatile display pixel data.

The present disclosure relates to a method and an apparatus for replacing a driving TFT of a pixel with a charge trapping memory.

The present disclosure relates to a method and an apparatus for increasing data access speed by storing pixel data based on a charge trapping memory.

The present disclosure relates to a method and an apparatus for providing a low-power and high-efficiency display pixel based on a charge trapping memory.

According to one embodiment of the present disclosure, in a display pixel that has a memory function, the display pixel may include a switching thin film transistor (TFT) configured to control whether the pixel is driven, a charge trapping TFT (CTTFT) configured to control a pixel driving current and perform a memory function, a storage capacitor configured to maintain a voltage applied based on the switching TFT, a first light-emitting light source configured to emit light through a current applied based on the CTTFT, and a second light-emitting light source configured to emit light to erase data based on the memory function of the CTTFT.

In addition, according to one embodiment of the present disclosure, in a display pixel that has a memory function, the display pixel may include a switching thin film transistor (TFT) configured to control whether the pixel is driven, a charge trapping TFT (CTTFT) configured to control a pixel driving current and perform a memory function, a first light-emitting light source configured to emit light through a current applied based on the CTTFT, and a second light-emitting light source configured to emit light to erase data based on the memory function of the CTTFT.

Moreover, according to one embodiment of the present disclosure, a method for storing and removing data in a display pixel that has a memory function may include setting an applied voltage of a CTTFT that controls a pixel driving current and performs a memory function to an off-state, storing data based on a trapping layer of the CTTFT by setting a first data line to an on-state with an applied voltage of a switching TFT that controls whether the pixel is driven to set a gate line to an on-state, setting an applied voltage of a second light-emitting light source that emits light to an on-state in order to erase data, and erasing the data from the trapping layer of the CTTFT by setting the applied voltage of the CTTFT to an off-state and setting the first data line to an on-state using the applied voltage of the switching TFT to set the gate line to an on-state.

In addition, the following matters may be commonly applied.

According to one embodiment of the present disclosure, a CTTFT may store data through a programming operation based on a memory function and erase data through an eraser operation based on the memory function.

In addition, according to one embodiment of the present disclosure, when the programming operation is performed based on the memory function, source and drain regions of the CTTFT may be set to the off-state by setting the applied voltage of the CTTFT to the off-state, and a gate line based on the CTTFT may be set to an on-state by setting a first data line to the on-state using an applied voltage of the switching TFT, and data may be stored in the CTTFT based on the gate line set to the on-state.

Moreover, according to one embodiment of the present disclosure, the CTTFT may include a tunneling layer, a trapping layer, and a barrier layer, and data may be stored based on a charge trap of the trapping layer through the gate line set to the on-state.

In addition, according to one embodiment of the present disclosure, when the programming operation is performed based on the memory function, the gate line may have a positive voltage, and different pieces of data may be stored based on the intensity of the applied voltage of the switching TFT.

Further, according to one embodiment of the present disclosure, when the eraser operation is performed based on the memory function, the second light-emitting light source may be set to the on-state by setting the second data line to the on-state using the applied voltage of the second light-emitting light source, a gate line based on the CTTFT may be set to the on-state by setting a first data line to the on-state using the applied voltage of the switching TFT, and the source and drain regions of the CTTFT may be set to the off-state by setting the applied voltage of the CTTFT to the off-state, thereby erasing the data stored in the CTTFT.

In addition, according to one embodiment of the present disclosure, the CTTFT may include a tunneling layer, a trapping layer, and a barrier layer, and when the eraser operation is performed, an electron-hole pair may be generated through the emission of light of the second light-emitting light source set to the on-state, and a hole in either the electron-hole pair may be transferred into the trapping layer so that an electron in the trapping layer is recombined with the hole, thereby removing the data stored in the CTTFT.

Moreover, according to one embodiment of the present disclosure, the CTTFT may be composed of a TFT substrate, a bottom gate of the TFT, a trapping layer for storing data, a channel layer made of an oxide semiconductor, a drain of the TFT, a source of the TFT, and a second light-emitting light source.

In addition, according to one embodiment of the present disclosure, the hole may be provided in the trapping layer based on the second light-emitting light source to erase the data stored in the trapping layer, and the second light-emitting light source may be integrated on the TFT substrate of the CTTFT so that the hole is inserted into the trapping layer in at least any one direction of a lateral direction, a downward direction, and a diagonal direction.

Further, according to one embodiment of the present disclosure, the second light-emitting light source may be integrated on the TFT substrate so that an electrode of the second light-emitting light source and electrodes of the drain and source of the TFT use different electrodes.

In addition, according to one embodiment of the present disclosure, the light-emitting light source may include at least any one of a light-emitting diode, a laser, a lamp, and a natural light source.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which:

FIGS. 3A, 3B, 3C and 3D are views showing programming and eraser operations of the charge trapping memory applied in the present disclosure.

FIG. 10 is a flowchart of a method for storing and erasing data in a display pixel applied in the present disclosure.

DETAILED DESCRIPTION OF EXEMPLARY EMBODIMENTS

Figure 1A:
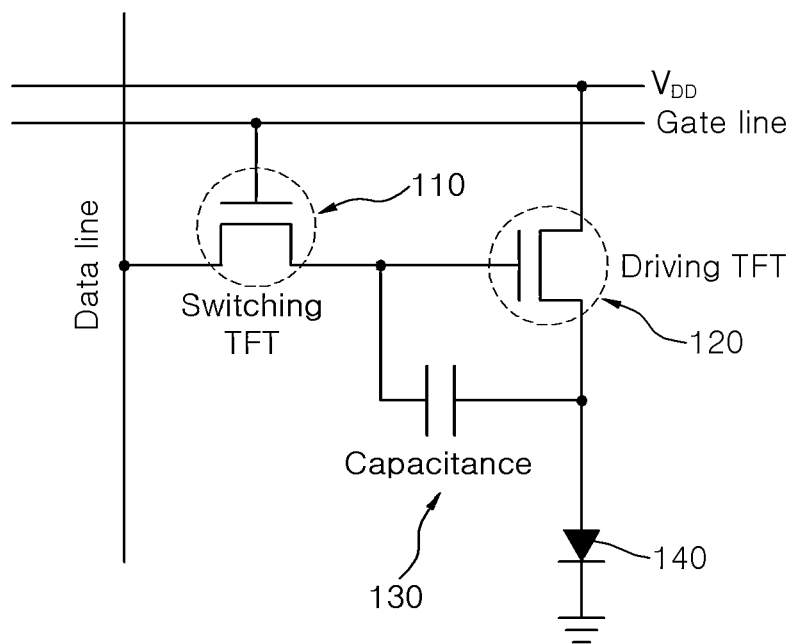
FIGS. 1A and 1B are views showing conventional display pixels applied in the present disclosure.

Hereinafter, preferred embodiments according to the present invention will be described in detail with reference to the accompanying drawings. The detailed description disclosed below with the accompanying drawings is intended to describe exemplary embodiments of the present invention and is not intended to represent the only embodiments by which the present invention may be practiced. The following detailed description includes specific details to provide a complete understanding of the present invention. However, those skilled in the art will recognize that the present invention may be practiced without these specific details.

The following embodiments are combinations of components and features of the present invention in predetermined forms. Each component or feature may be considered optional unless otherwise explicitly stated. Each component or feature may be practiced in a form that is not combined with other components or features. In addition, the embodiments of the present invention may be configured by combining some of the components and/or features The order of operations described in the embodiments of the present invention may be changed. Some components or features of one embodiment may be included in another embodiment or replaced with corresponding components or features of another embodiment.

Specific terms used in the following description are provided to help understand the present invention, and the use of these specific terms may be changed into other forms without departing from the technical spirit of the present invention.

In some cases, in order to avoid ambiguity related to the concept of the present invention, well-known structures and devices have been omitted or a block diagram form focusing on the key functions of each structure and device has been shown. In addition, the same components have been described using the same reference numerals throughout this disclosure.

Moreover, the terms first and/or second and the like may be used to describe various components in the present disclosure, but the components should not be limited by the terms. The above terms are only used for a purpose to distinguish one component from another, and for example, a first component may be referred to as a second component, and similarly, the second component may also be referred to as the first component without departing from the scope of rights according to the concept of the present disclosure.

In addition, throughout the disclosure, when a part is said to "include" a certain component, it does not exclude other components unless specifically stated otherwise, but it means that other components may be further included. In addition, terms such as " . . . unit" and " . . . part" described in the disclosure refer to a unit that processes at least one function or operation, which may be implemented by a combination of a hardware and/or a software.

Figure 1B:
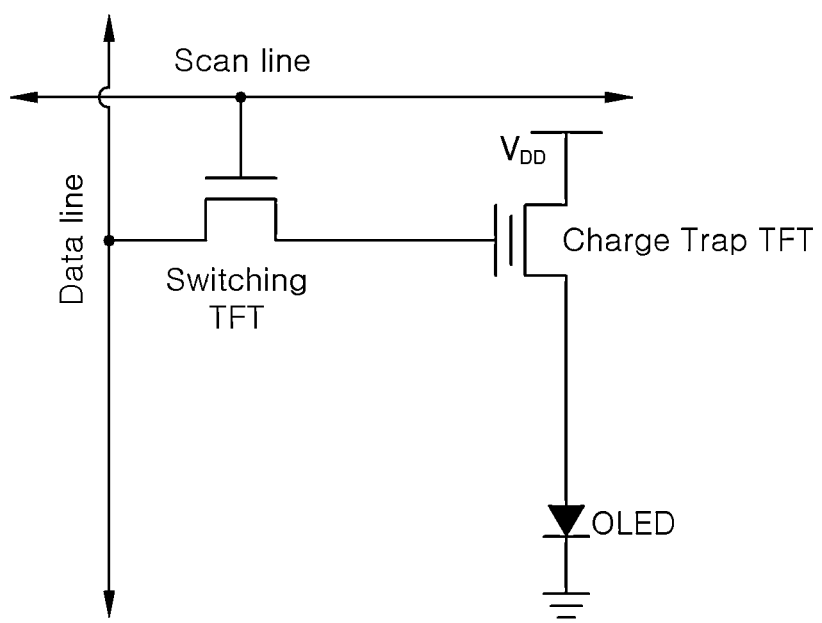

FIGS. 1A and 1B are views showing conventional display pixels applied to the present disclosure. Referring to FIGS. 1A and 1B, a conventional display pixel may include two TFTs 110 and 120 of a switching TFT 110 and a driving TFT 120. In addition, the display pixel may include a single capacitor C 130. The switching TFT 110 is a TFT that performs a switching function and may transmit a voltage to a gate line of the driving TFT 120. The driving TFT 120 may supply a current corresponding to a data voltage to an organic light emitting diode (OLED) 140 (or a light-emitting diode) according to the switching TFT 110. The display pixel may operate based on the structures of FIGS. 1A and 1B, but is not limited thereto.

However, there may be limitations in implementing a display for ultra-high resolution/ultra-low power through a circuit structure of the display pixel in FIGS. 1A and 1B. For example, when implementing an ultra-high resolution display, the amount of data expressed in the display pixel may increase, and thus unnecessary power consumption may be great during a continuous screen output process. Considering the above matter, there is a need to consider a display pixel in which a memory is implemented to improve data accessibility and reduce power consumption in the display pixel. For example, instead of the above-described driving TFT in the display pixel, a charge trapping memory may be used to implement the memory in the display pixel. The charge trapping memory may be composed of a tunneling layer, a trapping layer, and a barrier layer, and there is a region in which charges are stored in the trapping layer, and thus a memory function may be implemented.

Taking into consideration a high-resolution display, the amount of data to be displayed in the display pixel may increase, and thus a data access speed may decrease. In addition, power consumption may increase in order to continuously output data on the screen. More specifically, during the continuous screen output process, unnecessary power consumption may occur as the capacitor is repeatedly charged and discharged according to a refresh rate of the display as described above. Therefore, the driving TFT that performs only a role of current control in the display pixel circuit of FIGS. 1A and 1B may be changed to the charge trapping memory with a memory function, and based on this, the display pixel may be allowed to store data. Since the display pixel operates based on the stored data, a data access processing speed may increase, and power consumption may also be reduced. More specifically, when the memory is stored inside the display pixel, a capacitor voltage for driving the driving TFT may be reduced. Therefore, since a RC delay may be reduced, a quick response to a high refresh rate may be made possible, the amount of power required to charge the capacitor may be reduced, and the amount of power required may be reduced. However, after a programming operation in the charge trapping memory, a hole may need to be injected to perform an eraser operation. That is, in consideration of the eraser operation of the charge trapping memory, an external light source may be required. Considering the above matter, the display pixel may include a light source therein. Therefore, the display pixel may generate a photoelectric effect to enable an injection of a hole with respect to the eraser operation of the charge trapping memory.

Figure 2A:
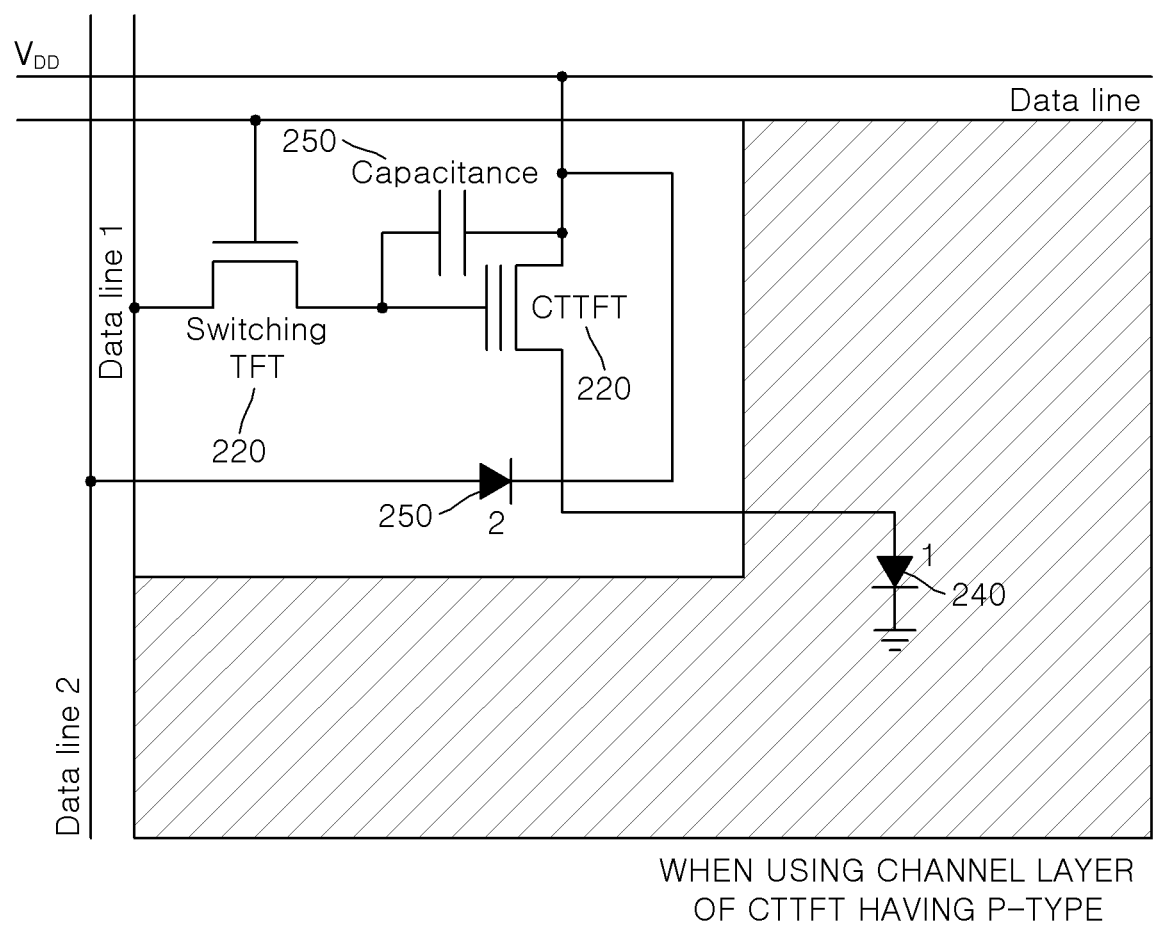
FIGS. 2A, 2B and 2C are views showing display pixels to which a charge trapping memory TFT applied in the present disclosure is applied.
Figure 2B:
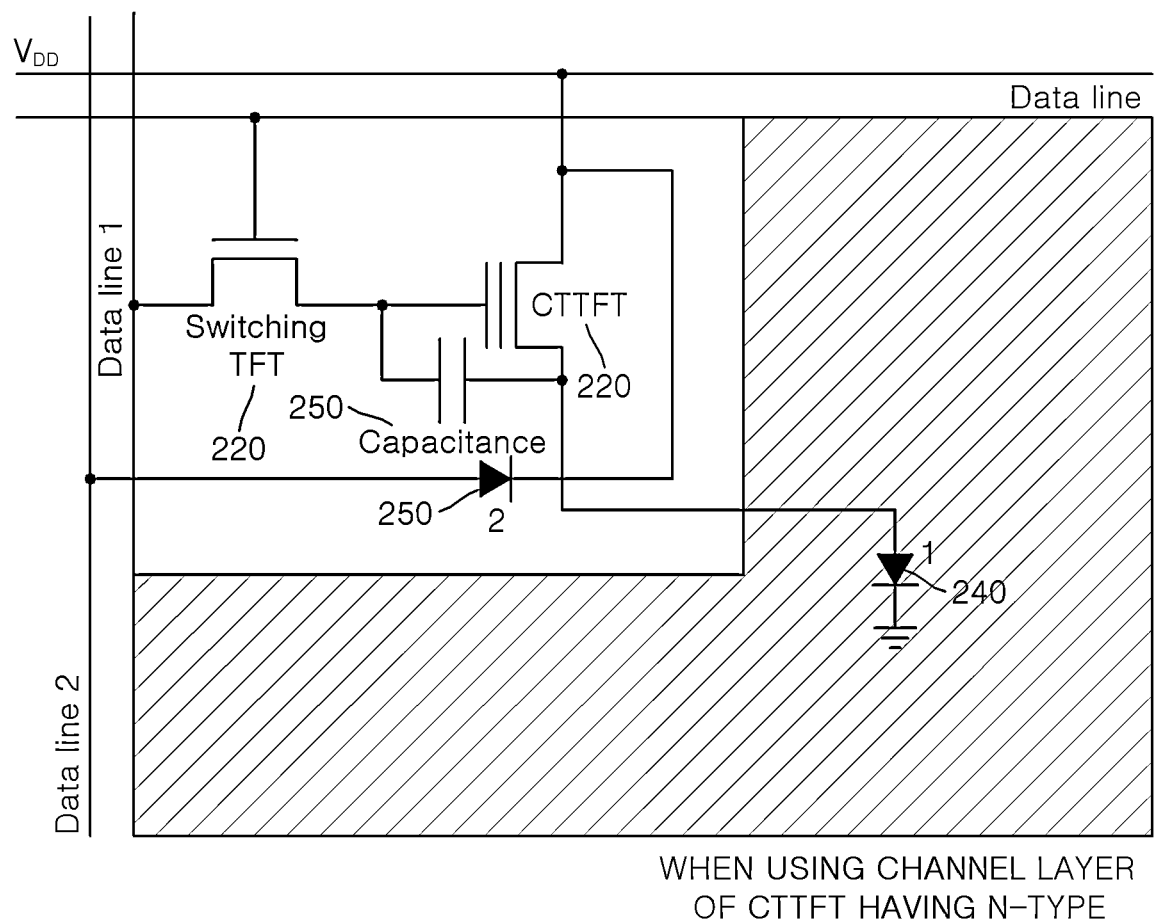
Figure 2C:
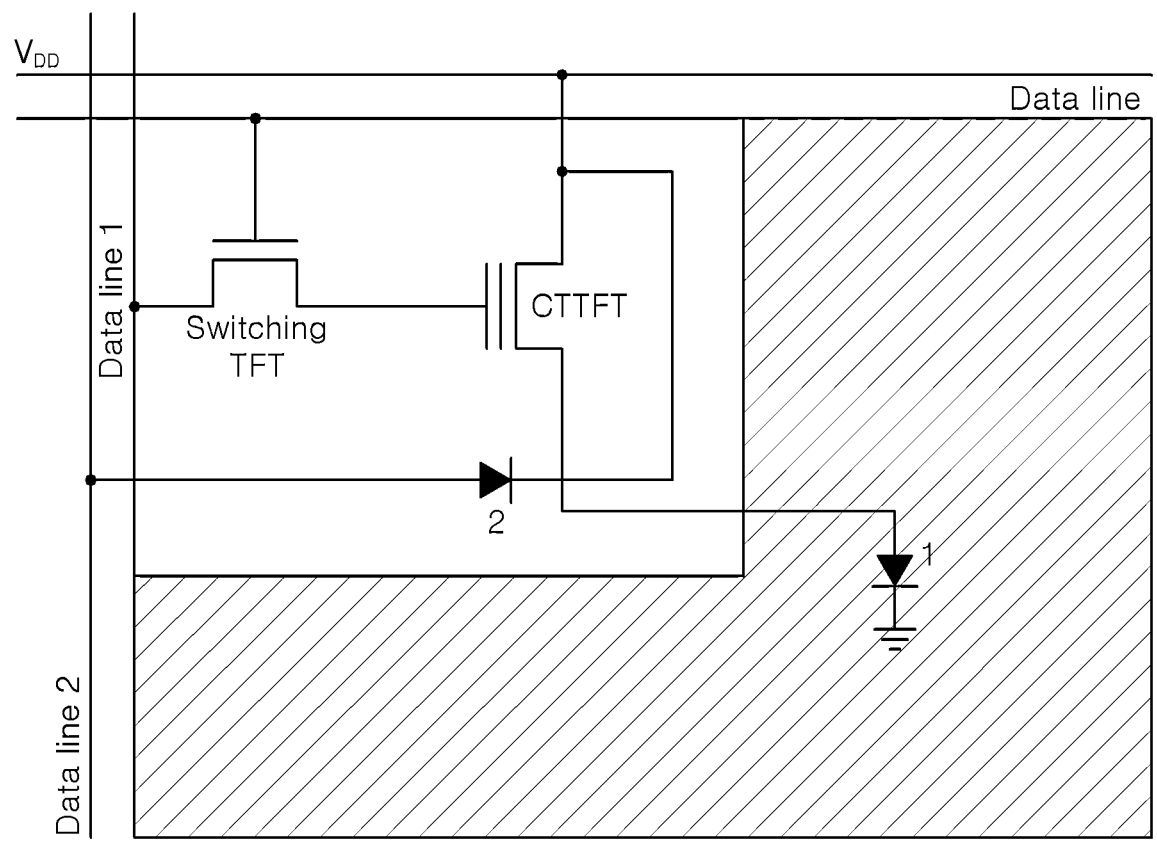

FIGS. 2A to 2C are views showing display pixels to which a charge trapping memory TFT applied in the present disclosure is applied. Referring to FIGS. 2A to 2C, a display pixel may include a switching TFT 210 that determines whether or not to drive, a charge trapping memory TFT (CTTFT) 220 that replaces the driving TFT, a capacitor 230 that maintains a voltage applied to the switching TFT, and light-emitting diodes 240 and 250. For example, the present disclosure is described based on a light-emitting diode for convenience of explanation, but the light-emitting diode may be a light-emitting light source. As a specific example, the light-emitting light source may include at least any one of a light-emitting diode, a laser, a lamp, and a natural light source. However, for convenience of explanation, the present disclosure is described based on the light-emitting diode as one of the light-emitting light sources, but is not limited thereto.

Meanwhile, the CTTFT 220 replacing the driving TFT may be an element that applies a current to a light-emitting diode 1 240 in a circuit driving state and stores switching data at the same time. That is, the light-emitting diode 1 240 may emit light via the current applied by the CTTFT 220. Here, a light-emitting diode 2 250 may be an element that emits light required when the eraser operation of the charge trapping memory is performed. For example, the charge trapping memory may perform programming and eraser operations by adjusting a threshold voltage based on an applied external voltage. As described above, the charge trapping memory has the trapping layer, and perform the memory function by trapping charges in the trapping layer. As another example, the capacitor 230 of FIG. 2A may be located at a source side in an upward direction compared to FIG. 1A. Specifically, when a channel layer of the CTTFT 220 is a p-type, the capacitor 230 may be located at the source side of a CTTFT channel in an upward direction in the drawing. On the other hand, the capacitor 230 of FIG. 2B may be located at the source side in a downward direction in a similar manner to FIG. 1A. Specifically, when the channel layer of the CTTFT 220 is an n-type, the capacitor 230 may be located at the source side of the CTTFT channel in a downward direction in the drawing. The reason for changing a capacitor position is that a current operation of the TFT varies depending on the P-type and the N-type. This may reduce a problem in which the charges in the capacitor escape without being stored by changing the capacitor position according to a direction at which a voltage is applied. Here, the position of the capacitor 230 may vary based on a type of oxide semiconductor, but is not limited thereto.

In addition, as shown in FIG. 2C, the pixel circuit may not include the capacitor 230.

Figure 3A:
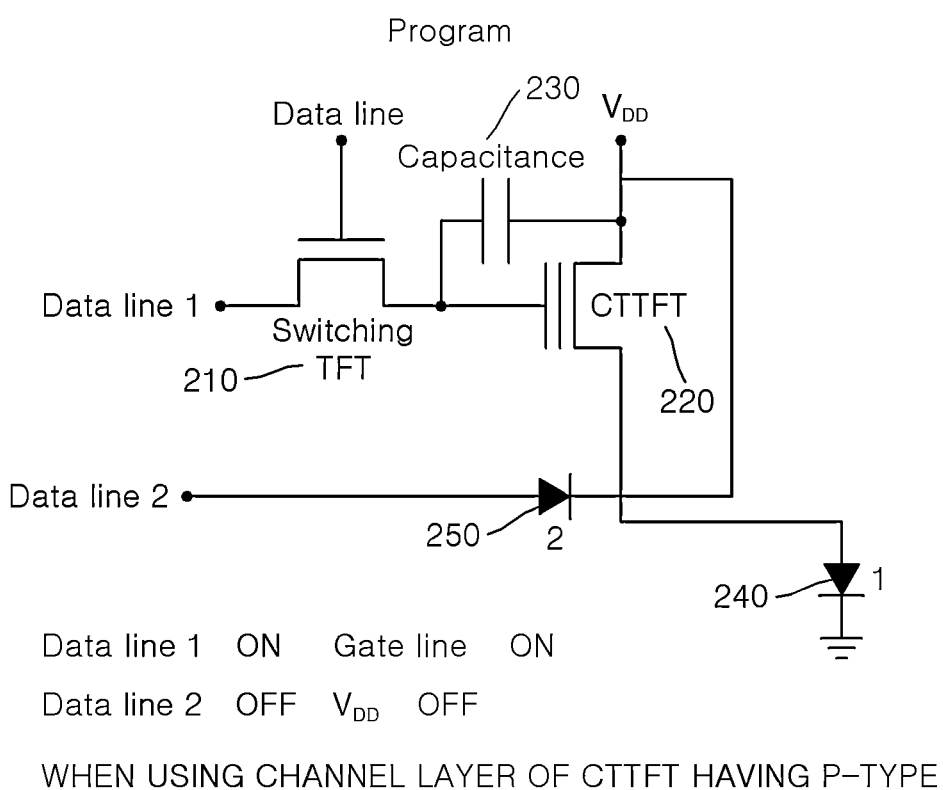
Figure 3C:
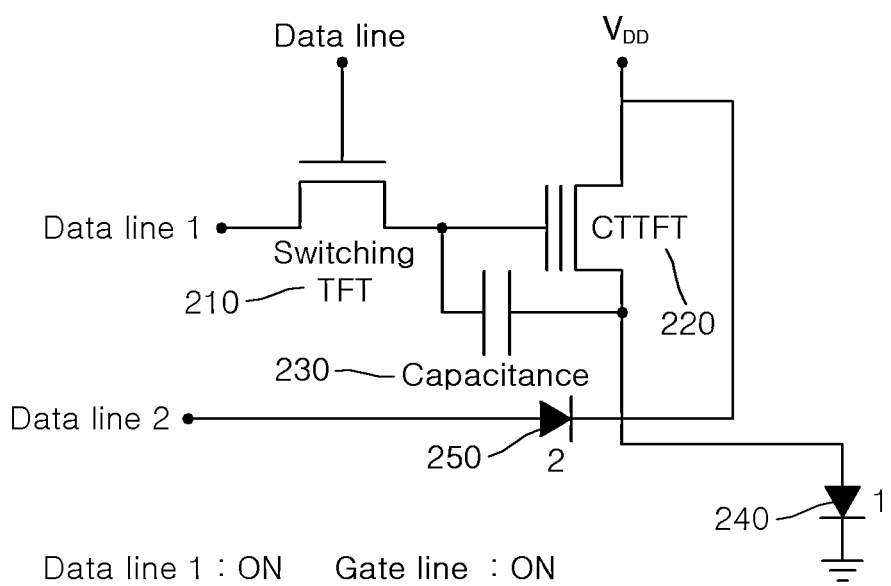

FIGS. 3A to 3D are views showing programming and eraser operations of the charge trapping memory applied to the present disclosure. Referring to FIGS. 3A to 3D, a programming operation and an eraser operation may be performed based on the charge trapping memory. Referring to FIGS. 3A and 3C, when the programming operation is performed in the charge trapping memory, $V_{DD}$ may be in an off-state in order to turn source and drain regions of the charge trapping memory off. Thereafter, in order to store data, a data line 1 may be converted to an on-state to convert a gate line to the on-state, and therefore, the programming operation may be performed. Here, for example, a threshold voltage of the charge trapping may be controlled by the degree of the applied external voltage, and accordingly, a programming may be performed. The programmability of the charge trapping memory may be based on the trap of the trapping layer of the charge trapping memory. That is, an operation of trapping charges in the trapping layer is performed, and based on this, the data may be stored in the pixel.

Figure 3D:
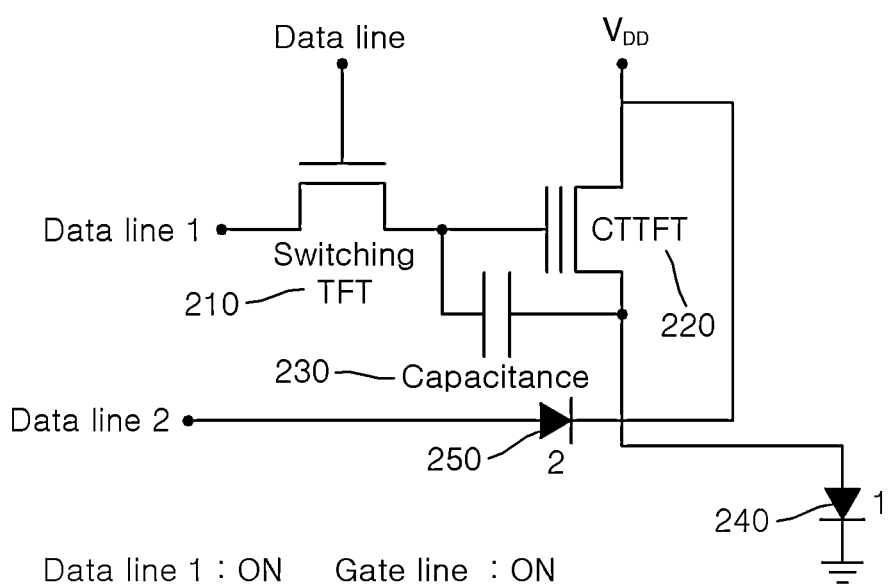

Referring to FIGS. 3B and 3D, when the eraser operation is performed in the charge trapping memory, a data line 2 may be converted to the on-state to generate an electron-hole pair in In—Sn—Zn—O (ITZO), that is, the channel layer of the charge trapping memory, so that the light-emitting diode 2 250 may be converted to the on-state. Thereafter, the data line 1 may be converted into the on-state to convert the gate line to the on-state, and $V_{DD}$ may be converted to the off-state to turn the source and drain regions of the charge trapping memory off. Therefore, the eraser operation may be performed in the charge trapping memory. That is, the charge may be removed by being recombined with the hole in the charge trapping layer, and based on this, the data may also be removed from the pixel. For example, in FIGS. 3A and 3B, the capacitor 230 may be located at the source side in an upward direction as in FIG. 2A, and in FIGS. 3C and 3D, the capacitor 230 may be located at the source side in a downward direction as in FIG. 2B.

Figure 4A:
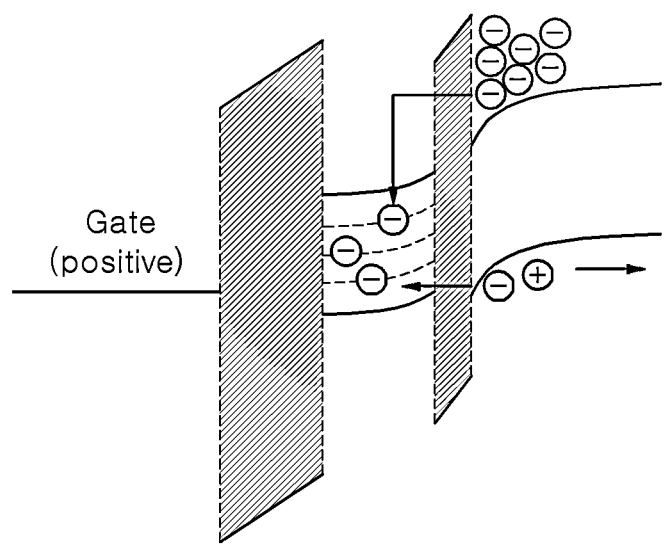
FIGS. 4A and 4B are views showing the programming operation and the eraser operation applied in the present disclosure.
Figure 4B:
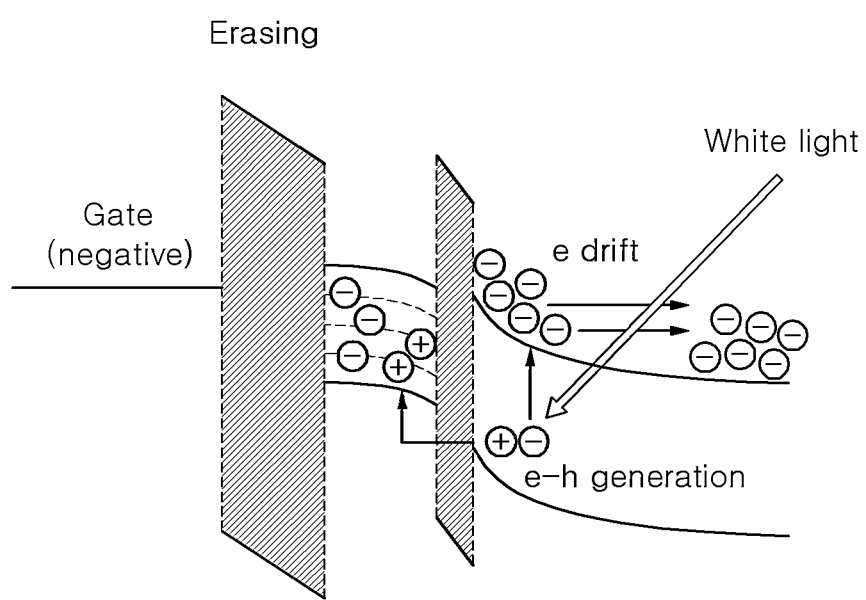
Figure 4C:
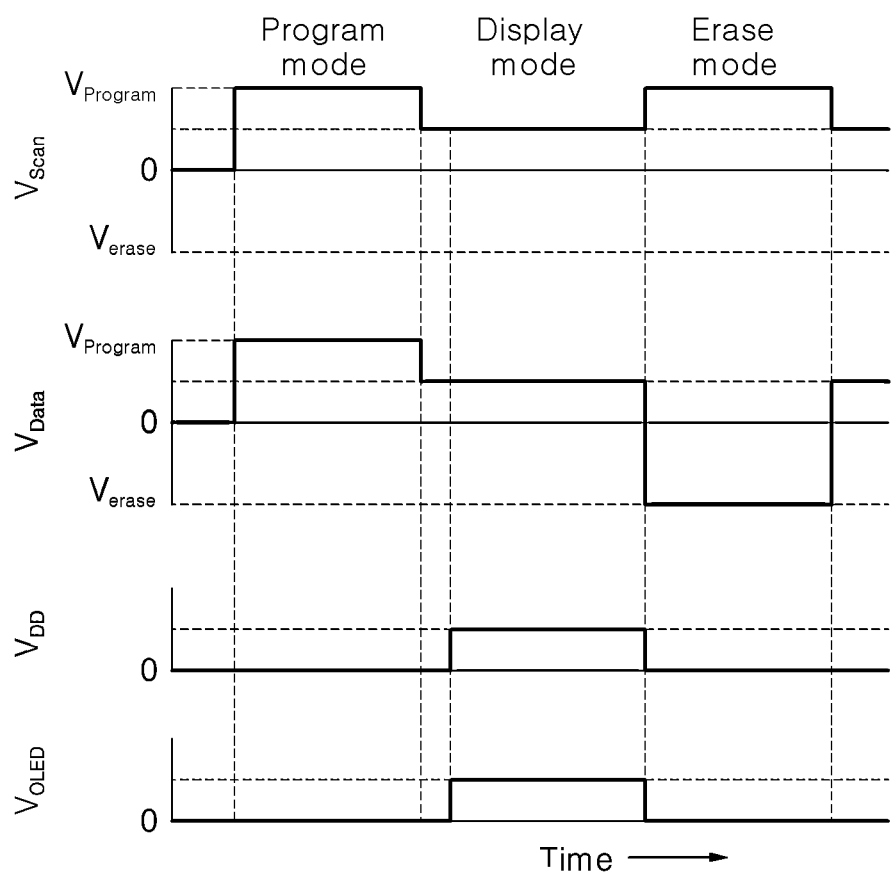
FIG. 4C is a timing diagram for describing the programming operation and the eraser operation.

FIGS. 4A and 4B are views showing the programming operation and the eraser operation applied to the present disclosure, and FIG. 4C is a timing diagram that describes the programming operation and the eraser operation. Referring to FIG. 4A, programming may be performed based on a method of storing charges of an ITZO channel layer in the trapping layer. Here, a gate voltage may be a positive voltage, and as described above, data storage may be performed differently depending on the degree of the applied external voltage. On the other hand, referring to FIG. 4B, when the ITZO channel layer is exposed to a light source, an electron-hole pair may be generated by the photoelectric effect. Here, the hole may pass through the tunneling layer, and the data may be erased by the recombination of the electron and the hole in the trapping layer, and therefore, the eraser operation in the charge trapping memory may be performed. For example, by introducing the charge trapping memory, the unit performance of the display pixel circuit may be improved, and thus, a high-resolution and low-power display may be implemented.

Figure 5A:
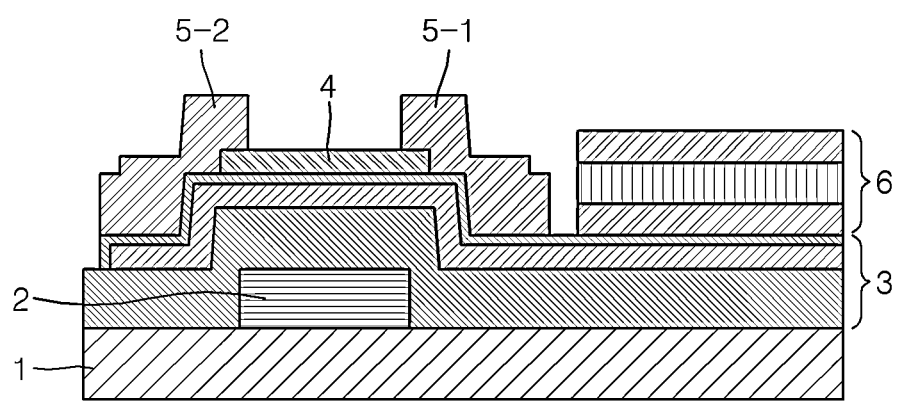
FIGS. 5A, 5B, 5C and 5D are views showing an integrated cross-sectional view of a charge trapping memory TFT and a light-emitting diode element that are applied in the present disclosure.
Figure 5B:
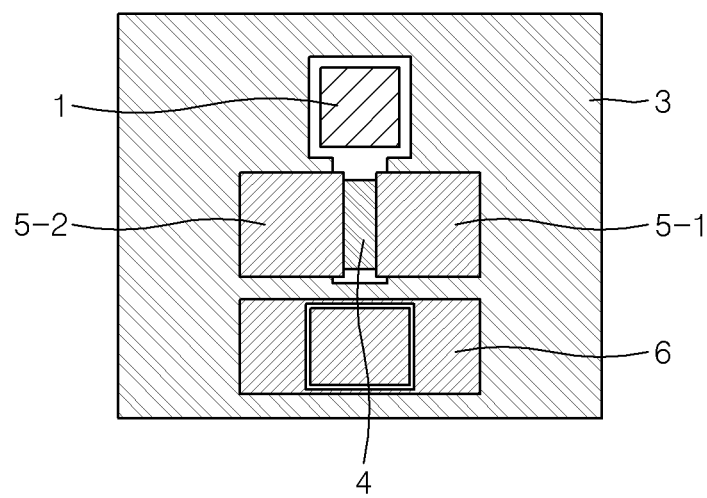
Figure 5C:
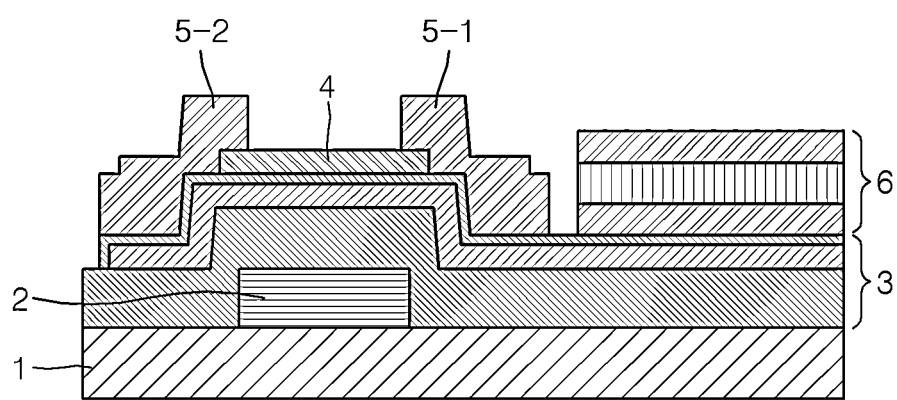
Figure 5D:
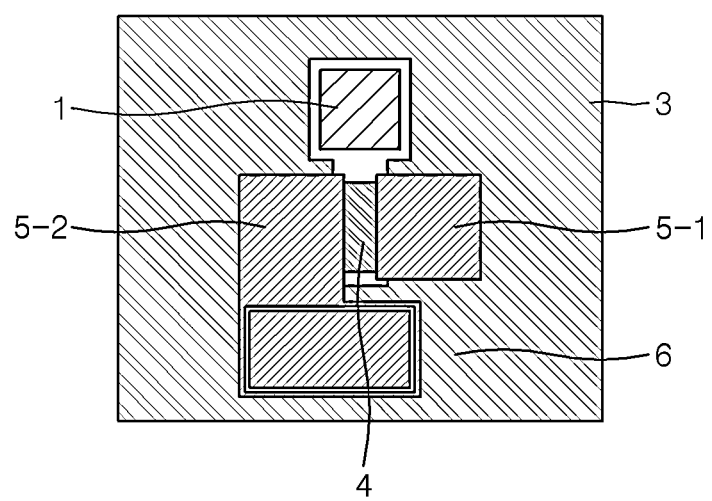

FIGS. 5A to 8B are views showing integrated cross-sectional views of a charge trapping memory TFT and a light-emitting diode element. Referring to FIGS. 5A to 5D, a charge trapping memory TFT (CTTFT) may be composed of a substrate 1 of the TFT element, a bottom gate 2 of the TFT, a charge trapping layer 3 for storing data, an oxide semiconductor 4 as a channel layer of the TFT, a drain 5-1 of the TFT, a source 5-2 of the TFT, and a light-emitting diode 6. Here, FIGS. 5A and 5C are cross-sectional views, FIG. 5B is a plan view of FIG. 5A, and FIG. 5D is a plan view of FIG. 5C.

As shown, the bottom gate 2 of the TFT may be integrated on the substrate 1 of the TFT element, and the charge trapping layer 3 for storing data may be integrated thereon. The bottom gate 2 of the TFT can minimize a leakage current so that light is not exposed to the charge trapping layer 3. In addition, an oxide semiconductor 4 as the channel layer of the TFT may be integrated on the charge trapping layer 3, and the drain 5-1 and the source 5-2 of the TFT may be located at an end of the channel layer of the TFT. In addition, in FIGS. 5A to 5D, the light-emitting diode 6 may be integrated as a separate layer on the charge trapping layer 3. In one example, the structure of FIGS. 5A to 5D may allow photoelectrons generated from the light-emitting diode 6 to enter a side of the charge trapping layer. Here, FIGS. 5A and 5B may configure the element so that a bottom electrode of the light-emitting diode 6 is not connected to the source 5-2 of the TFT. In another example, FIGS. 5C and 5D may configure the element so that the bottom electrode of the light-emitting diode 6 is connected to the source 5-2 of the TFT.

Figure 6A:
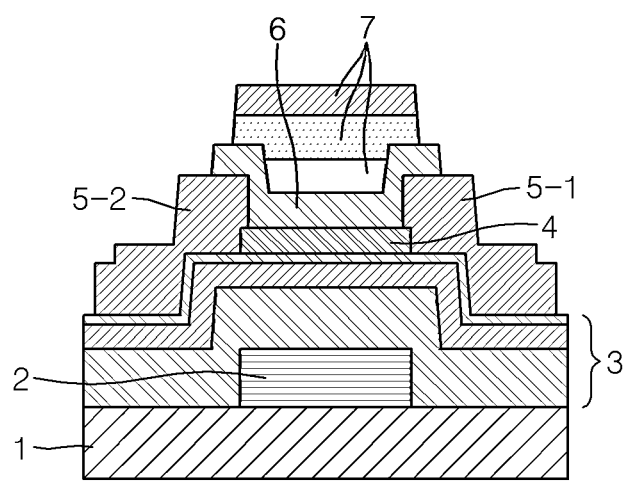
FIGS. 6A, 6B, 6C and 6D are views showing an integrated cross-sectional view of a charge trapping memory TFT and a light-emitting diode element that are applied in the present disclosure.
Figure 6B:
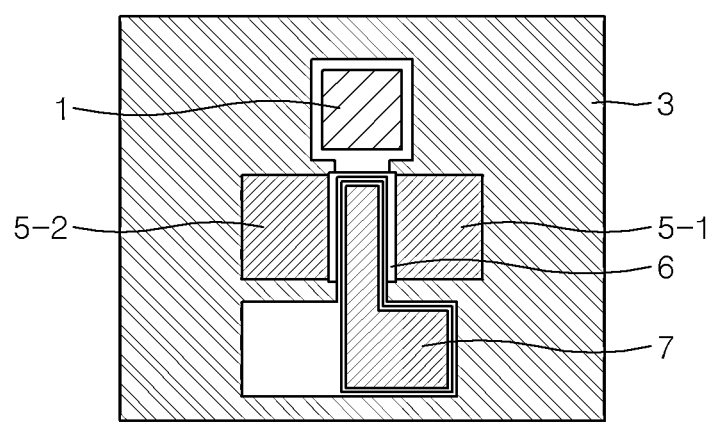
Figure 6C:
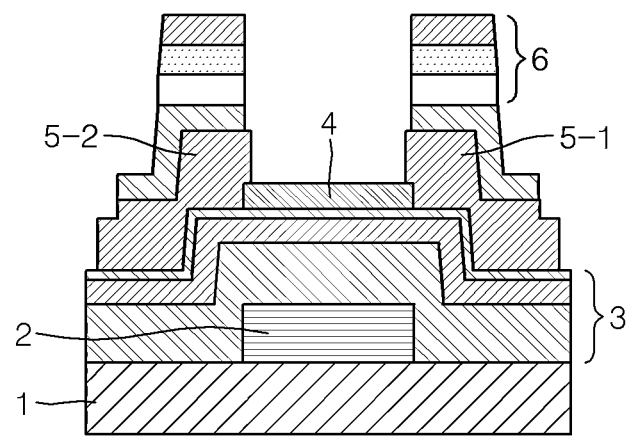
Figure 6D:
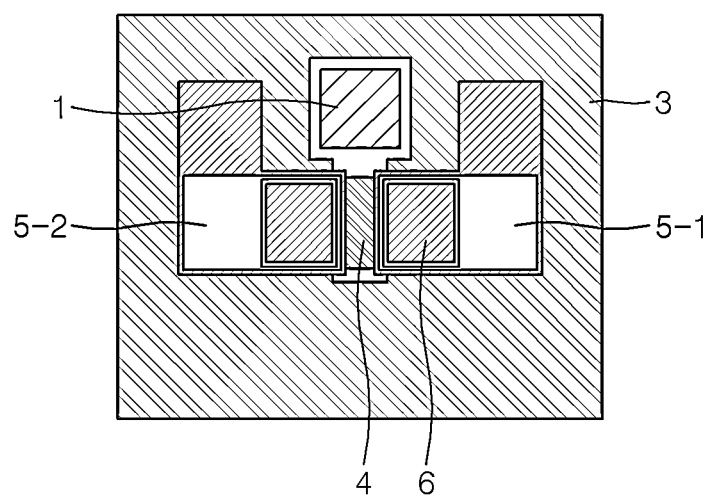

In yet another example, referring to FIGS. 6A to 6D, light-emitting diodes 6 and 7 may be integrated above an oxide semiconductor 4 as a channel layer of the TFT, a drain 5-1 of the TFT, a source 5-2 of the TFT, and the charge trapping layer 3. Therefore, photoelectrons generated from the light-emitting diodes 6 and 7 may enter in a direction from the top to the bottom. Here, FIG. 6A may be a structure for a case in which electrodes of the drain 5-1 and source 5-2 of the TFT are used separately from electrodes of the light-emitting diodes 6 and 7. Here, FIGS. 6A and 6C are cross-sectional views, FIG. 6B is a plan view of FIG. 6A, and FIG. 6D is a plan view of FIG. 6C.

As shown, FIGS. 6A and 6B may have transparent electrode-based structures, and these structures may be configured so that electrons generated from the light-emitting diodes 6 and 7 may be easily transmitted. On the other hand, FIGS. 6C and 6D may be a structure for a case in which the electrodes of the drain 5-1 and source 5-2 of the TFT are used together with the electrode of the light-emitting diode 6.

Figure 7A:
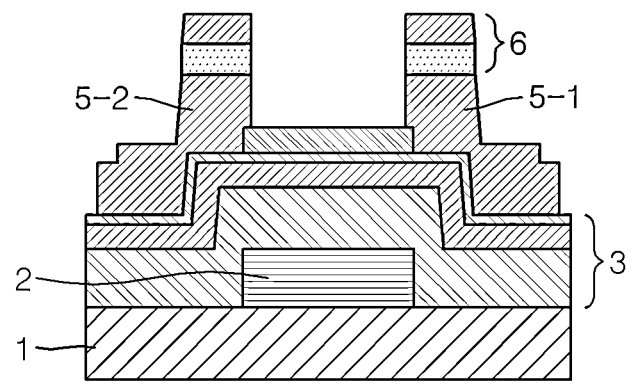
FIGS. 7A, 7B, 7C and 7D are views showing an integrated cross-sectional view of a charge trapping memory TFT and a light-emitting diode element that are applied in the present disclosure.
Figure 7B:
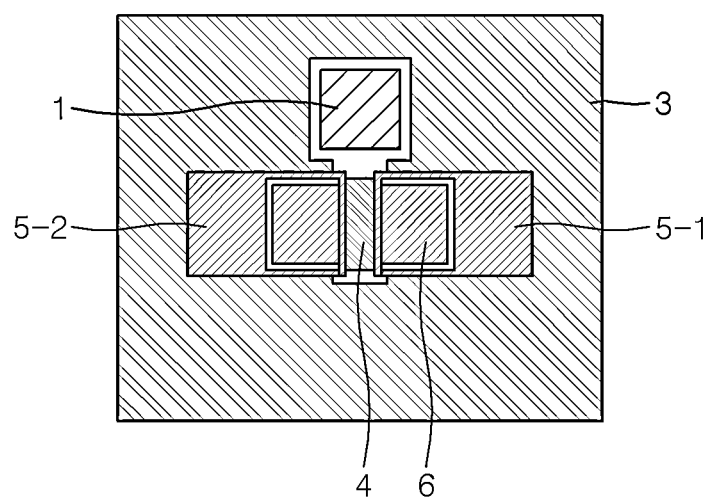
Figure 7C:
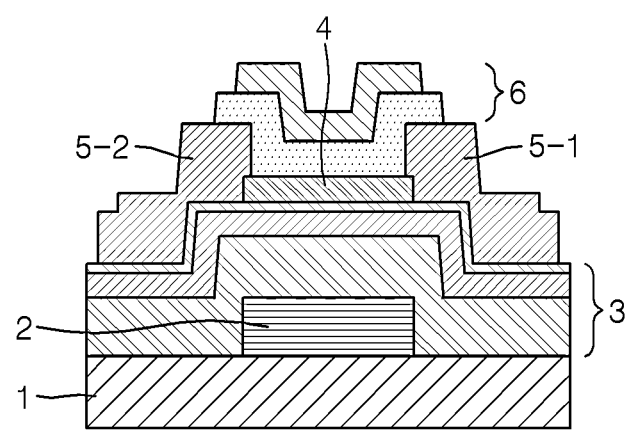
Figure 7D:
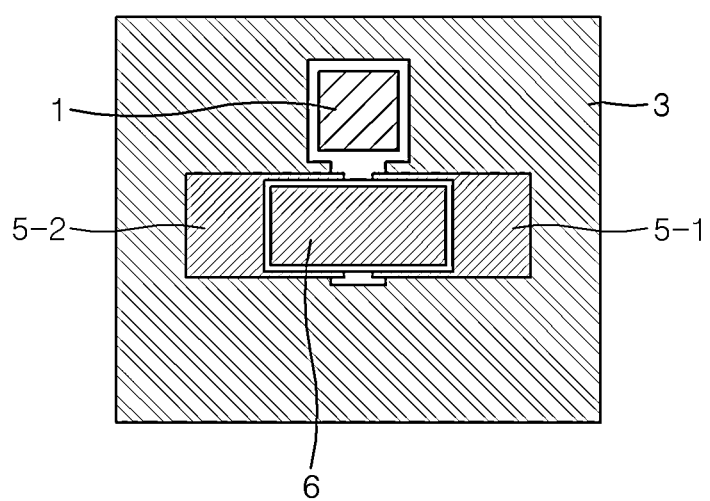

In yet another example, referring to FIGS. 7A to 7D, the structure of FIGS. 7A to 7D may have an integrated form in which photoelectrons generated from the light-emitting diode 6 enter in a diagonal direction. Here, FIGS. 7A and 7C are cross-sectional views, FIG. 7B is a plan view of FIG. 7A, and FIG. 7D is a plan view of FIG. 7C.

As shown, FIGS. 7A and 7B may represent a structure for a case in which electrodes of the drain 5-1 and source 5-2 of the TFT are used separately from an electrode of the light-emitting diodes 6. On the other hand, FIGS. 7C and 7D may represent a structure for a case in which the electrodes of the drain 5-1 and source 5-2 of the TFT are used together with the electrode of the light-emitting diode 6.

Figure 8A:
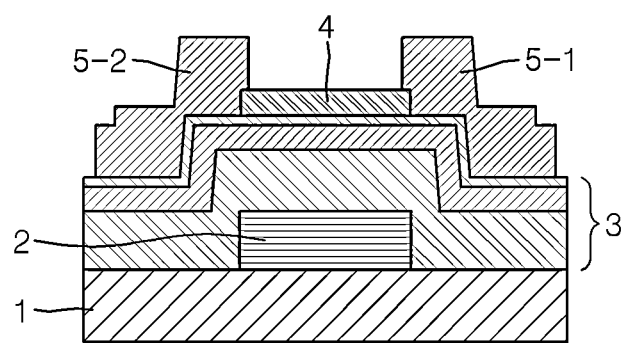
FIGS. 8A and 8B are views showing an integrated cross-sectional view of a charge trapping memory TFT and a light-emitting diode element that are applied in the present disclosure.
Figure 8B:
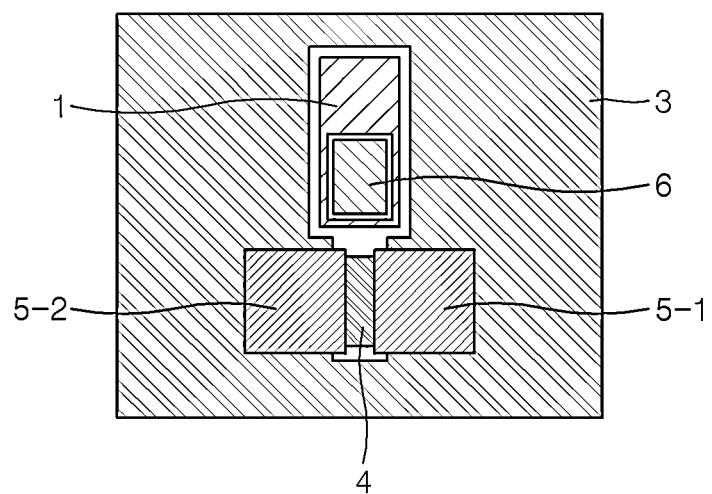

In yet another example, referring to FIGS. 8A and 8B, a light-emitting diode 6 may be integrated to be located behind an oxide semiconductor 4 as a channel layer of the TFT, the drain 5-1 of the TFT, and the source 5-2 of the TFT. Here, FIG. 8A is a cross-sectional view, and FIG. 8B is a plan view of FIG. 8A.

As shown, photoelectrons generated from the light-emitting diode 6 may enter in a direction from the rear to the front.

Based on the above-described structures of FIGS. 5A to 8B, a display pixel including a CTTFT instead of a driving TFT may be formed, thereby storing pixel data in order to increase data access and reduce power consumption.

Figure 9A:
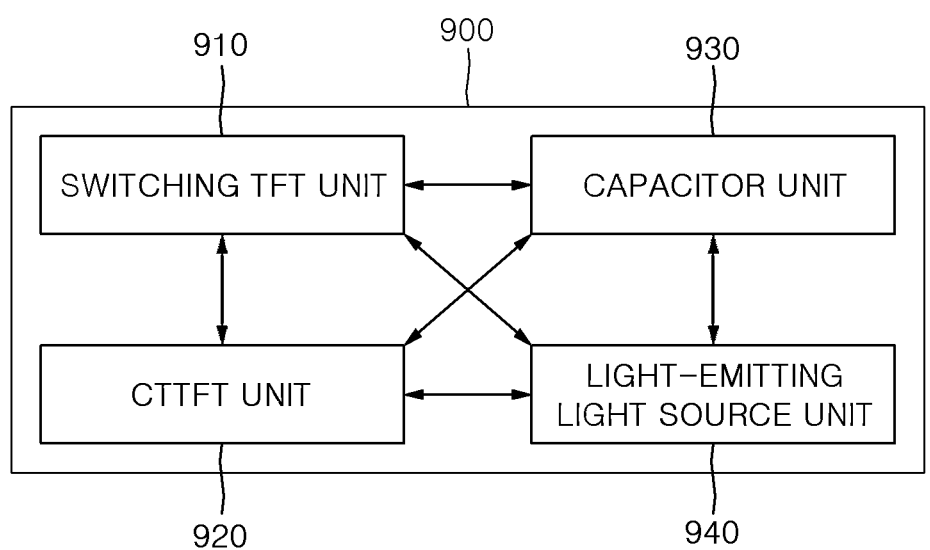
FIGS. 9A and 9B are views showing display pixels to which a charge trapping memory TFT applied in the present disclosure is applied.
Figure 9B:
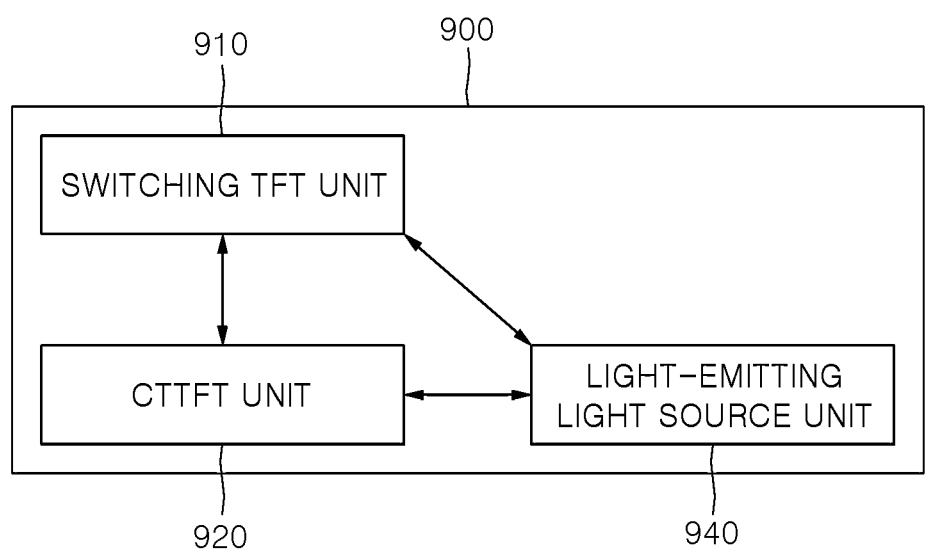

FIGS. 9A and 9B are views showing display pixels to which a charge trapping memory TFT applied in the present disclosure is applied. Referring to FIGS. 9A and 9B, a display pixel 900 having a memory function may include a switching TFT unit 910, a CTTFT unit 920, a capacitor unit 930, and a light-emitting light source unit 940. Here, as shown in FIG. 9B, the capacitor unit 930 may be omitted.

The switching TFT unit 910 may control whether the pixel is driven, and the CTTFT unit 920 may control a pixel drive current and perform a memory function. The capacitor unit 930 may maintain a voltage applied based on the switching TFT unit 910. The light-emitting light source unit 940 may include a first light-emitting diode and a second light-emitting diode. Here, the first light-emitting diode may emit light through a current applied based on the CTTFT unit 920, and the second light-emitting diode may emit light to erase data based on the memory function of the CTTFT unit 920. In one example, the CTTFT unit 920 may store data through a programming operation based on the memory function and erase data through an eraser operation based on the memory function. When the programming operation is performed based on the memory function, a source region of the CTTFT unit 920 and a drain region of the CTTFT unit 920 may be set to an off-state by setting $V_{DD}$ to the off state using a voltage applied to the CTTFT unit 920. In addition, a gate line based on the CTTFT unit 920 may be set to an on-state by setting a first data line to the on-state using an applied voltage of the switching TFT unit 910. Data may be stored in the CTTFT unit 920 based on the gate line being set to the on-state.

In addition, the CTTFT unit 920 may include a tunneling layer, a trapping layer, and a barrier layer. Here, data may be stored based on the charge trap of the trapping layer through the gate line set to the on-state. When the programming operation is performed based on the memory function, the gate line may have a positive voltage, and different pieces of data may be stored based on the intensity of the applied voltage of the switching TFT unit 910. In addition, when the eraser operation is performed based on the memory function, the second light-emitting diode may be set to the on-state by setting the second data line to the on-state using an applied voltage of the second light-emitting diode. In addition, a gate line based on the CTTFT unit 920 may be set to an on-state by setting a first data line to the on-state using an applied voltage of the switching TFT unit 910. Here, the source and drain regions of the CTTFT unit 920 may be set to the off-state by setting $V_{DD}$ to the off-state using the applied voltage of the CTTFT unit 920 to remove the data stored in the CTTFT unit 920.

In addition, when the eraser operation is performed, an electron-hole pair may be generated through the emission of light of the second light-emitting diode set to the on-state, and a hole either in the electron-hole pair may be transferred into the trapping layer so that an electron in the trapping layer is recombined with the hole, thereby removing the data stored in the CTTFT unit 920.

In addition, as one example, the CTTFT unit 920 may be composed of a TFT substrate, a bottom gate of the TFT, a trapping layer for storing data, a channel layer made of an oxide semiconductor, a drain of the TFT, a source of the TFT, and a second light-emitting diode. Here, a hole may be provided in the trapping layer based on the second light-emitting diode to erase the data stored in the trapping layer as described above. In one example, the second light-emitting diode may be integrated on the TFT substrate of the CTTFT so that the hole is inserted in the trapping layer in at least any one direction of a lateral direction, a downward direction, and a diagonal direction. In another example, the second light-emitting diode may be integrated on the TFT substrate so that the electrode of the second light-emitting diode and the electrodes of the drain and source of the TFT use different electrodes as described above.

FIG. 10 is a flowchart of a method for storing and erasing data in a display pixel applied in the present disclosure. Referring to FIG. 10, a display pixel may set an applied voltage of a CTTFT, which controls a pixel drive current and performs a memory function, to an off-state (S1010). Thereafter, a gate line may be set to an on-state by setting a first data line to the on-state using an applied voltage of a switching TFT that controls whether the pixel is driven, thereby storing data based on a trapping layer of the CTTFT (S1020).

In addition, when performing data eraser, an applied voltage of a second light-emitting light source that emits light to erase data may be set to the on-state (S1030). Thereafter, the applied voltage of the CTTFT may be set to the off-state, and the gate line may be set to the on-state by setting the first data line to the on-state using the applied voltage of the switching TFT, thereby erasing the data from the trapping layer of the CTTFT (S1040). Here, in one example, the CTTFT may store data through a programming operation based on the memory function and erase the data through an eraser operation based on the memory function. When the programming operation is performed based on the memory function, source and drain regions of the CTTFT may be set to the off-state by setting the applied voltage of the CTTFT to the off-state. Thereafter, the gate line based on the CTTFT may be set to the on-state by setting the first data line to the on-state using the applied voltage of the switching TFT, and data may be stored in the CTTFT based on the gate line being set to the on-state.

In addition, as one example, the CTTFT may include a tunneling layer, a trapping layer, and a barrier layer, and data may be stored based on charge trap of the trapping layer through the gate line set to the on-state. Here, when the programming operation is performed based on the memory function, the gate line may have a positive voltage, and different pieces of data may be stored based on the intensity of the applied voltage of the switching TFT.

When the eraser operation is performed based on the memory function, the second data line may be set to the on-state using the applied voltage of the second light-emitting light source to set the second light-emitting light source to the on-state. Thereafter, the gate line based on the CTTFT may be set to the on-state by setting the first data line to the on-state using the applied voltage of the switching TFT, and the source and drain regions of the CTTFT may be set to the off-state by setting the applied voltage of the CTTFT to the off-state, thereby removing the data stored in the CTTFT. Here, when the eraser operation is performed, an electron-hole pair may be generated through the emission of light of the second light-emitting light source set to the on-state, and a hole in either the electron-hole pair may be transferred into the trapping layer so that an electron in the trapping layer is recombined with the hole, thereby removing the data stored in the CTTFT.

In another example, the CTTFT may be composed of a TFT substrate, a bottom gate of the TFT, a trapping layer for storing data, a channel layer made of an oxide semiconductor, a drain of the TFT, a source of the TFT, and a second light-emitting light source. Here, the hole may be provided in the trapping layer based on the second light-emitting light source to erase the data stored in the trapping layer. Here, the second light-emitting light source may be integrated on the TFT substrate of the CTTFT so that the hole is inserted in the trapping layer in at least any one direction of a lateral direction, a downward direction, and a diagonal direction. In yet another example, the second light-emitting light source may be integrated on the TFT substrate so that an electrode of the second light-emitting light source and electrodes of the drain and source of the TFT use different electrodes.

The embodiments of the present invention described above may be implemented through various means. For example, the embodiments of the present invention may be implemented by a hardware, a firmware, a software, or a combination thereof.

In the case of implementation by hardware, methods according to the embodiments of the present invention may be implemented by one or more of an application-specific integrated circuit (ASIC), a digital signal processor (DSP), a digital signal processing device (DSPD), a programmable logic device (PLD), a field programmable gate array (FPGA), a processor, a controller, a microcontroller, a microprocessor, or the like.

In the case of implementation by firmware or software, methods according to the embodiments of the present invention may be implemented in the form of modules, procedures, functions, etc. that perform the functions or the operations that are described above. A software code may be stored in a memory unit and driven by a processor. The memory unit may be located inside or outside the processor and may exchange data with the processor through various known means.

The present disclosure has an effect of providing a method for storing non-volatile display pixel data.

The present disclosure has an effect of providing a method for replacing a driving TFT of a pixel with a charge trapping memory.

The present disclosure has an effect of providing a method for increasing data access speed by storing pixel data based on a charge trapping memory.

The present disclosure has an effect of providing a low-power consumption and high-efficiency display pixel based on a charge trapping memory.

The effects obtainable from the present disclosure are not limited to the effects mentioned above, and other effects not mentioned will be clearly understood by those skilled in the art to which the present invention belongs based on the descriptions below.

The detailed description of the preferred embodiments of the present invention disclosed as described above has been provided to enable those skilled in the art to implement and practice the present invention. Although the above matter has been described with reference to the preferred embodiments of the present invention, those skilled in the art will understand that the present invention may be variously modified and changed without departing from the spirit and scope of the present invention described in the following claims. Therefore, the present invention is not intended to be limited to the embodiments disclosed herein, but is intended to grant the broadest scope consistent with the principles and novel features disclosed herein. In addition, although the preferred embodiments of the present disclosure have been illustrated and described above, the present disclosure is not limited to the specific embodiments described above, and various modifications may be made by those skilled in the art without departing from the gist of the present disclosure as claimed in the claims, and such modifications should not be understood individually apart from the technical idea or prospect of the present disclosure.

In addition, both a product invention and a method invention are described in the present disclosure, and the descriptions of both inventions may be applied supplementarily as necessary.

What is claimed is:

1. A display pixel that has a memory function, comprising:
   a switching thin film transistor (TFT) configured to control whether the pixel is driven;
   a charge trapping TFT (CTTFT) configured to control a pixel driving current and perform a memory function;
   a storage capacitor configured to maintain a voltage applied based on the switching TFT;
   a first light-emitting light source configured to emit light through a current applied based on the CTTFT; and
   a second light-emitting light source configured to emit light to erase data based on the memory function of the CTTFT.

2. The display pixel of claim 1, wherein
the CTTFT stores data through a programming operation based on the memory function and erases data through an eraser operation based on the memory function.

3. The display pixel of claim 2, wherein
when the programming operation is performed based on the memory function, source and drain regions of the CTTFT are set to an off-state by setting an applied voltage of the CTTFT to the off-state,
a gate line based on the CTTFT is set to an on-state by setting a first data line to an on-state using an applied voltage of the switching TFT, and
data is stored in the CTTFT based on the gate line being set to the on-state.

4. The display pixel of claim 3, wherein
the CTTFT includes a tunneling layer, a trapping layer, and a barrier layer, and
the data is stored based on a charge trap of the trapping layer through the gate line set to the on-state.

5. The display pixel of claim 4, wherein
when the programming operation is performed based on the memory function, the gate line has a positive voltage, and different pieces of data are stored based on an intensity of the applied voltage of the switching TFT.

6. The display pixel of claim 2, wherein
when the eraser operation is performed based on the memory function, the second light-emitting light source is set to an on-state by setting a second data line to the on-state using an applied voltage of the second light-emitting light source,
a gate line based on the CTTFT is set to the on-state by setting a first data line to an on-state using an applied voltage of the switching TFT, and
source and drain regions of the CTTFT are set to an off-state by setting an applied voltage of the CTTFT to the off-state, thereby erasing data stored in the CTTFT.

7. The display pixel of claim 6, wherein
the CTTFT includes a tunneling layer, a trapping layer, and a barrier layer, and
when the eraser operation is performed, an electron-hole pair is generated through emission of light of the second light-emitting light source set to the on-state, a hole in either the electron-hole pair is transmitted into the trapping layer, and an electron in the trapping layer and the hole are recombined so that the data stored in the CTTFT is removed.

8. The display pixel of claim 1, wherein
the CTTFT includes a TFT substrate, a bottom gate of the TFT, a trapping layer storing data, a channel layer made of an oxide semiconductor, a drain of the TFT, a source of the TFT, and the second light-emitting light source.

9. The display pixel of claim 8, wherein
a hole is provided in the trapping layer based on the second light-emitting light source to erase the data stored in the trapping layer, and
the second light-emitting light source is integrated on the TFT substrate of the CTTFT so that the hole is inserted into the trapping layer in at least any one direction of a lateral direction, a downward direction, and a diagonal direction.

10. The display pixel of claim 9, wherein
the second light-emitting light source is integrated into the TFT substrate so that an electrode of the second light-emitting light source and electrodes of the drain and the source of the TFT use different electrodes.

11. The display pixel of claim 1, wherein
the first and second light-emitting light sources include at least any one of a light-emitting diode, a laser, a lamp, and a natural light source.

12. A display pixel that has a memory function, comprising:
- a switching thin film transistor (TFT) configured to control whether the pixel is driven;
- a charge trapping TFT (CTTFT) configured to control a pixel driving current and perform a memory function;
- a first light-emitting light source configured to emit light through a current applied based on the CTTFT; and
- a second light-emitting light source configured to emit light to erase data based on the memory function of the CTTFT.

13. A method for storing and removing data in a display pixel that has a memory function, the method comprising:
- setting an applied voltage of a charge trapping TFT (CTTFT) that controls a pixel driving current and performs a memory function to an off-state;
- storing data based on a trapping layer of the CTTFT by setting a first data line using an applied voltage of a switching TFT that controls whether the pixel is driven to an on-state to set a gate line to an on-state;
- setting an applied voltage of a second light-emitting light source that emits light to an on-state in order to erase data; and
- erasing the data from the trapping layer of the CTTFT by setting the applied voltage of the CTTFT to an off-state and setting the first data line using the applied voltage of the switching TFT to an on-state to set the gate line to an on-state.

14. The method of claim 13, wherein
when the data is stored based on the trapping layer of the CTTFT, the data is stored based on a charge trap of the trapping layer through the gate line set to the on-state.

15. The method of claim 14, wherein
when the data is stored based on the trapping layer of the CTTFT, the gate line has a positive voltage, and different pieces of data are stored based on an intensity of the applied voltage of the switching TFT.

16. The method of claim 13, wherein
when the data is erased from the trapping layer of the CTTFT, an electron-hole pair is generated through emission of light of the second light-emitting light source set to the on-state, a hole in either the electron-hole pair is transmitted into the trapping layer, and an electron in the trapping layer is recombined with the hole so that the data stored in the CTTFT is removed.

17. The method of claim 13, wherein
the CTTFT includes a TFT substrate, a bottom gate of the TFT, the trapping layer storing data, a channel layer made of an oxide semiconductor, a drain of the TFT, a source of the TFT, and the second light-emitting light source.

18. The method of claim 17, wherein
a hole is provided in the trapping layer based on the second light-emitting light source to erase data stored in the trapping layer, and
the second light-emitting light source is integrated on the TFT substrate of the CTTFT so that the hole is inserted into the trapping layer in at least any one direction of a lateral direction, a downward direction, and a diagonal direction.

19. The method of claim 18, wherein
the second light-emitting diode is integrated into the TFT substrate so that an electrode of the second light-emitting light source and electrodes of the drain and the source of the TFT use different electrodes.

* * * * *